(12) United States Patent  (10) Patent No.: US 8,502,592 B2
Gion  (45) Date of Patent: Aug. 6, 2013

(54) LEVEL SHIFT CIRCUIT

(71) Applicant: Panasonic Corporation, Osaka (JP)

(72) Inventor: Masahiro Gion, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/659,307

(22) Filed: Oct. 24, 2012

(65) Prior Publication Data

US 2013/0043926 A1  Feb. 21, 2013

Related U.S. Application Data

(63) Continuation of application No. PCT/JP2011/004016, filed on Jul. 13, 2011.

(30) Foreign Application Priority Data

Nov. 12, 2010 (JP) ................................. 2010-254163

(51) Int. Cl.
*H03L 5/00* (2006.01)
(52) U.S. Cl.
USPC ................ 327/333; 326/80; 326/81
(58) Field of Classification Search
USPC ...................... 327/333; 326/80, 81
See application file for complete search history.

(56) References Cited

U.S. PATENT DOCUMENTS

| | | | |
|---|---|---|---|
| 7,215,188 B2 * | 5/2007 | Ramaraju et al. | ............. 327/544 |
| 7,808,294 B1 | 10/2010 | Kottapalli | |
| 2001/0013795 A1 | 8/2001 | Nojiri | |
| 2003/0042965 A1 | 3/2003 | Kanno et al. | |
| 2004/0257142 A1 | 12/2004 | Kanno et al. | |
| 2005/0285659 A1 | 12/2005 | Kanno et al. | |

FOREIGN PATENT DOCUMENTS

| | | |
|---|---|---|
| JP | 2001-298356 A | 10/2001 |
| JP | 2004-064632 A | 2/2004 |

OTHER PUBLICATIONS

International Search Report issued in International Patent Application No. PCT/JP2011/004016 dated Aug. 16, 2011.

* cited by examiner

*Primary Examiner* — Kenneth B. Wells
(74) *Attorney, Agent, or Firm* — McDermott Will & Emery LLP

(57) ABSTRACT

In a level shift circuit allows satisfactory operation with short delay time in the case of low-voltage setting of a low-voltage source, for example, when a state of an input signal IN transitions from a H (VDD) level to a L level, a node W2 precharged to a H (VDD3) level is discharged to ground (VSS) by a discharge circuit N2, and decreases in potential. The decrease in potential propagates to a latch circuit LA, and an output of the latch circuit LA propagates to an output circuit OC. Further, an inversion signal of the node W2 is input to the output circuit OC by bypassing the latch circuit LA. Thus, the output circuit OC starts operating prior to operation based on an output of the latch circuit LA.

10 Claims, 8 Drawing Sheets

LEVEL SHIFT CIRCUIT

CROSS-REFERENCE TO RELATED APPLICATION

This is a continuation of PCT International Application PCT/JP2011/004016 filed on Jul. 13, 2011, which claims priority to Japanese Patent Application No. 2010-254163 filed on Nov. 12, 2010. The disclosures of these applications including the specifications, the drawings, and the claims are hereby incorporated by reference in their entirety.

BACKGROUND

The present disclosure relates to level shift circuits for converting voltage levels of signals, and specifically to a level shift circuit which operates at a low voltage.

FIG. 5 is a circuit diagram illustrating a conventional level shift circuit.

The level shift circuit of FIG. 5 includes two n-type transistors N51, N52, two cross-coupled p-type transistors P51, P52, and a first inverter INV50, wherein the gate and the drain of the p-type transistor P51 are connected to the drain and the gate of the p-type transistor P52, respectively.

The first inverter INV50 inverts an input signal from an input terminal IN, and is powered by a low-voltage source VDD at, for example, 1.5 V. The devices except the first inverter INV50 are high-voltage devices powered by a high-voltage source VDD3 at, for example, 3.3 V. The two n-type transistors N51, N52 have sources coupled to ground, and receive signals complementary to each other. That is, the n-type transistors N51, N52 receive the input signal from the input terminal IN and an inversion signal from the first inverter INV50, respectively, where the inversion signal is obtained by inverting the input signal by the first inverter INV50. The two p-type transistors P51, P52 have sources connected to the high-voltage source VDD3, and gates and drains cross-coupled to each other. The drain of the p-type transistor P51 and the drain of the p-type transistor P52 are connected to the drain of the n-type transistor N51 and the drain of the n-type transistor N52, respectively. An interconnection node between the p-type transistor P51 and the n-type transistor N51 on one side is a node W51, and an interconnection node between the p-type transistor P52 and the n-type transistor N52 on the other side is a node W52. Moreover, an output terminal OUT is connected to the node W52.

Next, operation of the conventional level shift circuit will be described. During stable operation, for example, when the input signal is at a H (VDD) level, and the inversion signal of the input signal is at a L (VSS=0 V) level, the n-type transistor N51 is in an on state, the n-type transistor 52 is in an off state, the p-type transistor P51 is in the off state, and the p-type transistor P52 is in the on state. Moreover, the node W51 which is a node on the one side is at the L (VSS) level, and the node W52 which is a node on the other side is at a H (VDD3) level. Since the n-type transistor N51 and the n-type transistor N52 are complementary to the p-type transistor P51 and the p-type transistor P52, respectively, no current flows during the stable operation.

After that, when the input signal transitions to the L (VSS) level, and state transition occurs, the n-type transistor N51 is turned off, and the n-type transistor N52 is turned on. Thus, a through current flows from the high-voltage source VDD3 to ground via the p-type transistor P52 and the n-type transistor N52 which are in the on state, and the potential at the node W52 starts decreasing from the H (VDD3) level. When the potential at the node W52 decreases to or below a value given by the expression VDD3−Vtp (Vtp is the threshold voltage of the p-type transistor P52), turning on of the p-type transistor P51 is started, so that the potential at the node W51 (potential at the gate of the p-type transistor P52) increases to reduce a drain current of the p-type transistor P52, and the potential at the node W52 further decreases.

Eventually, the potential at the node W51 reaches the H (VDD3) level, and the potential at the node W52 reaches the L (VSS) level, so that the through current no longer flows, and an output logic is inverted, resulting in a stand-by mode for a next transition of the input signal. The case of transition of the input signal from the H level (VDD) to the L level (VSS) has been described, but a similar statement applies to the opposite situation. Converting H-level and L-level signals by the level converter circuit can thus generate H-level and L-level signals having different voltage levels.

Here, assume that the low-voltage source VDD is set to a low voltage close to the threshold voltage of each of the n-type transistors N51, N52 (e.g., 0.7 V).

In general, a drain current of a transistor is proportional to the square of a difference between a gate voltage and a threshold voltage. Thus, drain currents of the n-type transistors N51, N52 exponentially decrease when the low-voltage source VDD is set to decrease in voltage. Assume that the input signal transitions from the H level (VDD) to the L level (VSS). In this case, the drain current of the n-type transistor N52 decreases, whereas the drain current of the p-type transistor P52 does not decrease. This significantly slows that the rate of decrease in the potential at the node W52, so that eventually, delay time that an output signal OUT takes to transition from the H level (VDD3) to the L level (VSS) rapidly increases.

As a measure against the above problem, the gate width of each of the n-type transistors N51, N52 may be increased to obtain high drain currents when the n-type transistors N51, N52 are turned on. However, as previously described, the drain currents of the transistors exponentially decrease when the low-voltage source VDD is set to decrease in voltage, and thus to compensate the decrease, the gate widths have to be significantly increased. This significantly increases the device area, and thus is not practical.

As another measure, the gate width of each of the p-type transistors P51, P52 may be reduced to obtain low drain currents when the p-type transistors P51, P52 are turned on. Assume that the input signal transitions from the H level (VDD) to the level (VSS). In this case, the measure allows the potential at the node W52 to more rapidly decrease, and the increase in delay time that the output signal OUT takes to transition from the H level (VDD3) to the L level (VSS) can be reduced. In contrast to the above case, assume that the input signal transitions from the L level (VSS) to the H level (VDD). In this case, the drain current of the p-type transistor P52 decreases, which increases time required for the potential at the node W52 to increase to the H level (VDD3), so that the delay time that the output signal OUT takes to transition from the L level (VSS) to the H level (VDD3) may be increased.

As described above, in the conventional level shift circuit, it has not been possible to simultaneously reduce both the rising time and the falling time of the potential at the node W52. Signal delay at the output terminal OUT depends on both the rising time and the falling time of the potential at the node W52. Thus, with this circuit configuration, it has been difficult to reduce the increase in delay time in the case of low-voltage setting of the low-voltage source.

Thus, in order to solve the problem arising in the case of the low-voltage setting of the low-voltage source, conventionally, for example, Japanese Patent Publication No. 2001-298356 has proposed a level shift circuit.

The proposed level shift circuit is illustrated in FIG. 6. The level shift circuit is configured to perform precharge control of a node W51 and a node W52, and detects a change in potential from a H level (VDD3) to a L level (VSS) at the node W51 and the node W52.

Specifically, in contrast to the level shift circuit of the FIG. 5, the level shift circuit of FIG. 6 includes an n-type transistor N53 connected between an n-type transistors N51 and ground (VSS), and an n-type transistor N54 connected between an n-type transistors N52 and ground (VSS), wherein instead of cross coupling the gates of p-type transistors P51, P52, the gate of the n-type transistor N53 and the gate of the n-type transistor N54 are respectively connected to the gate of the p-type transistor P51 and the gate of the p-type transistor P52 to perform precharge operation on the nodes W51, W52.

NAND circuits Nand51, Nand52, and inverters INV51, 52 are further disposed. The NAND circuit Nand51 receives output signals from the node W51 and the NAND circuit Nand52, and the NAND circuit Nand52 receives output signals from the node W52 and the NAND circuit Nand51. The inverter INV51 receives the output signal from the NAND circuit Nand51, and an output of the inverter INV51 is connected to the gate of the p-type transistor P51 and the gate of the n-type transistor N53. The inverter INV52 receives the output signal from the NAND circuit Nand52, and an output of the INV52 is connected to the gate of the p-type transistor P52 and the gate of the n-type transistor N54. With this configuration, a decrease in potential at the nodes W51, W52 is detected, and the precharge operation performed on the nodes W51, W52 is controlled.

Moreover, a pull-up resistor R54 set to a high resistance value is connected between the node W51 and the node W52 so that the nodes W51, W52 do not transition to a floating state. Moreover, an output terminal OUT is connected to an output of the NAND circuit Nand52 via an output circuit including an inverter INV53.

In the conventional level shift circuit having a precharge control function, for example, when an input signal is at a H level (VDD), the nodes W51, W52 are both at the H level (VDD3), an output of the NAND circuit Nand51 is at the H level (VDD3), the output of the NAND circuit Nand52 is at the L level (VSS), and the state of an output logic of a latch circuit including the NAND circuits Nand51, Nand52 is held. Moreover, the output of the inverter INV51 is at the L level (VSS), the output of the inverter INV52 is at the H level (VDD3), and the p-type transistor P51 is in an on state and is connected to a high-voltage source VDD3, whereas the n-type transistor N53 is in an off state and is disconnected from ground (VSS), so that the node W51 is precharged to a potential equal to the potential of the high-voltage source VDD3. On the other hand, the p-type transistor P52 is in the off state and is disconnected from the high-voltage source VDD3, whereas the n-type transistor N54 is in the on state and connects the n-type transistor N52 to ground, and the node W52 is pulled up to a high potential of the high-voltage source VDD3 by the p-type transistor P51 in the on state, the pull-up resistor R54, and the n-type transistor N52 in the off state.

From this state, during state transition in which the input signal transitions from the H level (VDD) to the L level (VSS), the n-type transistor N51 is turned off, and the n-type transistor N52 is turned on, so that the node W52 is connected to ground via the n-type transistor N54 in the on state, thereby reducing the potential at the node W52. When the potential at the node W52 decreases below the switching level of the NAND circuit Nand52, the output of the NAND circuit Nand52 is inverted to the H level (VDD3), the output of the NAND circuit Nand51 is also inverted to the L level (VSS), and an output logic of the output terminal OUT is inverted from the H level (VDD3) to the L level (VSS). Further, an output logic of the inverter INV51 is inverted to the H level (VDD3), and an output logic of the inverter INV52 is inverted to the L level (VSS), so that the n-type transistor N54 is turned off and disconnects the node W52 from ground, whereas the p-type transistor P52 is turned on and connects the node W52 to the high-voltage source VDD3. Thus, the node W52 is precharged to a potential equal to the potential of the high-voltage source VDD3. Furthermore, the p-type transistor P51 is turned off, the n-type transistor N53 is turned on, and the node W51, which has been in a precharged state, is pulled up to the high-voltage source VDD3 by the p-type transistor P52 in the on state, the pull-up resistor R54, and the n-type transistor N51 in the off state, thereby resulting in a stand-by mode for a next transition of the input signal.

The case of transition of the input signal from the H level (VDD) to the L level (VSS) has been described, but a similar statement applies to the opposite situation. Thus, converting H-level and L-level signals by the level converter circuit can generate H-level and L-level signals having different voltage levels.

As described above, in the level shift circuit of FIG. 6, the delay of the output terminal OUT depends on the transition from the H level (VDD3) to the L level (VSS) both at the node W51 and at the node W52, but does not depend on the transition from the L level (VSS) to the H level (VDD3) at the node W51 and the node W52. Thus, setting the resistance value of the pull-up resistor R54 to a high value can increase the speed of the transition from the H level (VDD3) to the L level (VSS) at the node W51 and the node W52, so that it is possible to effectively reduce the increase in delay time in the case of the low-voltage setting of the low-voltage source.

SUMMARY

However, as described above, the proposed level shift circuit of FIG. 6 is operable at a high speed compared to the conventional level shift circuit of FIG. 5 even when the voltage value of the low-voltage source (VDD) is set to a low voltage close to the threshold voltage of the n-type transistors N51, N52, but when the voltage value of the low-voltage source (VDD) is set to a voltage higher than the threshold voltage of the n-type transistor N51, N52 (hereinafter referred to as a normal voltage), there is a problem where time delay from the state transition of the input signal to the state transition of the output signal is long. A configuration including a large number of logic stages is a cause of the problem, but it was found that a major cause of the problem is that a large number of transistors are connected to the node W53 and the node W54 of FIG. 6, and load capacities at the nodes at which the transistors are connected increase, thereby increasing rising and falling delay at the node W54 (output node of the latch circuit). Application circuits as examples of a circuit in which a larger number of transistors are connected to the node W53 and the node W54 have been commonly used, and in this case, the delay further increases. An example of such circuits is illustrated in FIG. 7.

A level shift circuit illustrated in FIG. 7 is a circuit disposed between an upstream circuit (not shown) driven by a high-voltage source (VDD3) and a downstream circuit (not shown) driven by a low-voltage source (VDD), and for reduced power consumption which has been required recently, has a function applicable to the case where power supply from the low-voltage source (VDD) to the circuit having a large leakage current and driven by the low-voltage source (VDD) is stopped and shut down, and only a voltage of the high-voltage source VDD3 is applied to the downstream circuit. With this function, the level shift circuit of FIG. 7 can solve the following problems, which the level shift circuit of FIG. 6 may have. Specific description will be given below.

The level shift circuit of FIG. 7 is different from that of FIG. 6 in that the inverters INV51, INV52 of FIG. 6 are respectively replaced with NOR circuits Nor51, Nor52 in FIG. 7, the two-input NAND circuits Nand51, Nand52 of FIG. 6 are respectively replaced with three-input NAND circuits Nand53, Nand54 in FIG. 7, and three control signals C51, C52, C53 are further added in FIG. 7.

The level shift circuit of FIG. 6 is powered only by the high-voltage source VDD3, and when the low-voltage source VDD is shut down, an input signal and an inversion signal of the input signal are indeterminable, so that the gate potential of each of an n-type transistor N51 and an n-type transistor N52 is indeterminable. If the potential is intermediate potential, any one of an n-type transistor N53 or an n-type transistor N54 is necessarily in the on state, which causes a problem where a through current continuously flows. Moreover, when the through current thus flows, indeterminable potential further propagates such that a node W51 or a node W52 may also have intermediate potential, and a subsequent stage may also have intermediate potential, and the through current flows, resulting in a problem where an output is indeterminable.

In contrast, when the level shift circuit illustrated in FIG. 7 is powered only by the high-voltage source VDD3, and the low-voltage source VDD is shut down, the control signal C53 is set to a H level (VDD3), so that outputs of the NOR circuits Nor51, Nor52 are at a L level (VSS), and both the n-type transistors N53, N54 which receive the outputs of the NOR circuits Nor51, Nor52 are turned off, which can stop the through current. Moreover, when the control signal C51 is set to the H level (VDD3), and the control signal C52 is set to the L level (VSS), a signal of an output terminal OUT can be determined to be at the H level (VDD3), whereas when the control signal C51 is set to the L level (VSS), and the control signal C52 is set to the H level (VDD3), the signal of the output terminal OUT can be determined to be at the L level (VSS). Note that during normal operation, that is, when both the high-voltage source VDD3 and the low-voltage source VDD are applied, the control signal C51 is set to the H level (VDD3), the control signal C52 is set to the H level (VDD3), and the control signal C53 is set to the L level (VSS), thereby resulting in a circuit equivalent of the level shift circuit of FIG. 6, so that normal level shift operation can be performed.

As described above, the level shift circuit illustrated in FIG. 7 is effective when for the reduced power consumption which has been required recently, the low-voltage source (VDD) is shut down to stop operation of the upstream circuit, and such a level shift circuit configured for the purpose of reducing power consumption will be important.

However, as can be seen from FIG. 8 illustrating details of specific internal configurations of the NOR circuits Nor51, Nor52, the NAND circuits Nand53, Nand54, and the inverter INV53, the level shift circuit of FIG. 7 includes eight transistors Tr1-Tr8 connected to the node W53, and ten transistors Tr6-Tr15 connected to the node W54. For this reason, load capacities of the nodes W53, W54 are significantly higher than those of the other nodes, and thus rising and falling delay time at the nodes W53, W54 is significantly long. In particular, the falling delay time is further increased because the highly loaded nodes W53, W54 are driven by three serially connected n-type transistors of each of the NAND circuits Nand53, Nand54.

In one general aspect, the instant application describes a level shift circuit capable of reducing delay time until the transition of an output signal in response to transition of an input signal in the case of low-voltage setting where a voltage of a low-voltage source (VDD) is set to a low voltage close to a threshold voltage of a transistor configured to receive the input signal and an inversion signal of the input signal, wherein the level shift circuit is capable of reducing the delay time until the transition of the output signal also in the case of normal-voltage setting where the voltage of the low-voltage source (VDD) is set to a normal voltage.

In the above general aspect, the level shift circuit capable of reducing the delay time in the case of the low-voltage setting of the low-voltage source further includes a signal path in an output stage thereof, wherein the signal path bypasses a node causing long rising and falling delay to allow a signal of an output terminal to transition.

Specifically, in a first aspect of the present disclosure, a level shift circuit which includes an input terminal and an output terminal, converts an input signal input to the input terminal and having a first voltage amplitude into an output signal having a second voltage amplitude, and outputs the output signal from the output terminal includes: a precharge circuit; a first node and a second node which are precharged to a high level in a stably operating state by the precharge circuit; a first discharge circuit configured to discharge the first node to a low level upon transition of the input signal from the low level to the high level; a second discharge circuit configured to discharge the second node to the low level upon transition of the input signal from the high level to the low level; a latch circuit connected to the first node and the second node, an output of the latch circuit being reset to the low level by the transition of the first node to the low level, and the output of the latch circuit being set to the high level by the transition of the second node to the low level to control the precharge circuit; and an output circuit configured to receive the output of the latch circuit, wherein the output circuit further receives a signal from the first node and an inversion signal from the second node, or an inversion signal from the first node and a signal from the second node.

According to a second aspect of the present disclosure, in the output circuit in the level shift circuit of the first aspect, a node configured to receive the inversion signal from the first or second node has load capacitance which is smaller than a load capacitance of an output node of the latch circuit.

According to a third aspect of the present disclosure, in the output circuit in the level shift circuit of the first aspect, transistors connected to a node configured to receive the inversion signal from the first or second node are fewer than transistors connected to an output node of the latch circuit.

According to a fourth aspect of the present disclosure, in the level shift circuit of the first aspect, the output circuit starts inversion operation upon reception of both the signals from the first and second nodes, and after that, the output circuit holds the inversion operation when the output circuit receives the output of the latch circuit.

According to a fifth aspect of the present disclosure, in the level shift circuit of the first aspect, the latch circuit includes a precharge control circuit configured to control precharge operation of the precharge circuit based on latch operation.

According to a sixth aspect of the present disclosure, the level shift circuit of the first aspect further includes: a pull-up device, wherein while any one of the first or second node is precharged by the precharge circuit, the other of the first or second node is pulled up to the high level by the pull-up device.

According to a seventh aspect of the present disclosure, in the level shift circuit of the first aspect, the first and second discharge circuits include transistors, and a voltage source configured to generate a voltage having the first voltage amplitude is set to a generation voltage which is equal to a voltage close to a threshold voltage of the transistors.

According to an eighth aspect of the present disclosure, in the level shift circuit of the first aspect, the first and second discharge circuits include transistors, and a voltage source configured to generate a voltage having the first voltage amplitude is set to a generation voltage which is higher than a voltage close to a threshold voltage of the transistors.

According to a ninth aspect of the present disclosure, in the level shift circuit of the fifth aspect, when voltage supply from a voltage source configured to generate a voltage having the first voltage amplitude is stopped, the precharge control circuit receives a control signal to control and force the precharge circuit to perform the precharge operation.

According to a tenth aspect of the present disclosure, in the level shift circuit of the ninth aspect, when the voltage supply from the voltage source configured to generate the voltage having the first voltage amplitude is stopped, the latch circuit receives another control signal to determine the output signal from the output terminal to be at the high or low level.

As described above, in the level shift circuit of the first to tenth aspect, when the input signal transitions, the precharged first or second node transitions from the H level to the L level, and in response to the transition, a signal of the output terminal transitions. Thus, the transition of the signal of the output terminal does not depend on the transition of the first or second node from the L level to the H level. Thus, also in the case of the low-voltage setting of the low-voltage source, an increase in delay time of signal transition at the output terminal can be effectively reduced.

Moreover, in the case of the normal-voltage setting of the low-voltage source, a change in potential at the first or second node propagates to the output circuit by bypassing the latch circuit, and the transition of the output of the output circuit starts prior to transition of output of the latch circuit, so that signal transition at the output terminal occurs at an early point in time, thereby reducing the delay time of the signal transition at the output terminal.

Moreover, also in the case of the low-voltage setting of the low-voltage source, a change in potential at the first or second node propagates to the output circuit by bypassing the latch circuit. Thus, in a manner similar to the case of the normal-voltage setting of the low-voltage source, the delay time of the signal transition at the output terminal is reduced.

As described above in terms of the configuration, according to the level shift circuit of the first to tenth aspects, delay of the signal transition at the output terminal depends on the transition from the H level to the L level at the first and second node, but does not depend on the transition from the L level to the H level at the first and second node. Thus, an increase in delay time of the signal transition at the output terminal in the case of the low-voltage setting of the low-voltage source is effectively reduced, and the delay time of the signal transition at the output terminal can be effectively reduced also in the case of the normal-voltage setting and the low-voltage setting of the low-voltage source.

DETAILED DESCRIPTION

A level shift circuit of an embodiment of the present invention will be described below with reference to the drawings.

First Embodiment

Figure 1:
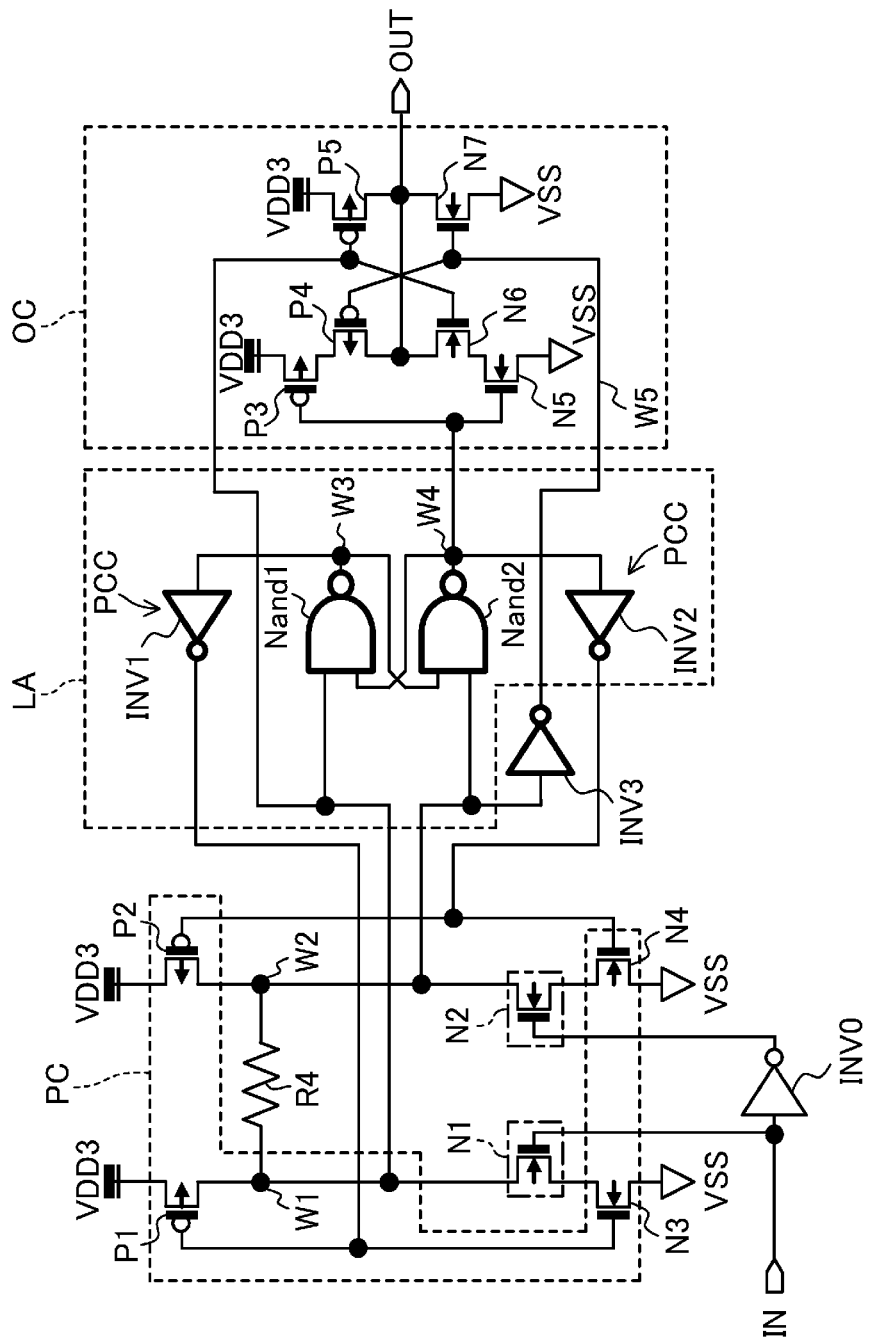
FIG. 1 is a view illustrating a configuration of a level shift circuit of a first embodiment of the present invention.

FIG. 1 illustrates a configuration of a level shift circuit of a first embodiment of the present invention.

In the figure, an input terminal IN receives a signal whose first voltage amplitude is a low voltage of a low-voltage source (VDD), and an inverter INV0 inverts the signal input to the input terminal IN, and is powered by the low-voltage source (VDD). In the level shift circuit of FIG. 1, all devices except the inverter INV0 are powered by a high-voltage source (VDD3).

Between a node W1 and ground, two n-type transistors N1, N3 are serially disposed, and between a node W2 and ground, two n-type transistors N2, N4 are serially disposed. The n-type transistors N1, N2 are a pair of n-type transistors which receive signals complementary to each other, that is, the gate of the n-type transistor N1 (first discharge circuit) receives the signal from the input terminal IN, and the gate of the n-type transistor N2 (second discharge circuit) receives an inversion signal from the inverter INV0.

Here, the voltage value of the low-voltage source (VDD) will be described. The voltage value may be set to a generation voltage (e.g., 0.7 V) which is equal to a voltage close to a threshold voltage of the pair of n-type transistors N1, N2 which receive the complementary signals, or may be set to a higher generation voltage (e.g., 1.5 V) than the threshold voltage. A high voltage of the high-voltage source (VDD3) is set to, for example, 3.3 V.

Between the node W1 and the high-voltage source VDD3, a p-type transistor P1 is disposed, and between the node W2 and the high-voltage source VDD3, a p-type transistor P2 is disposed. The gate of the n-type transistor N3 is connected to the gate of the p-type transistor P1, and the gate of the n-type transistor N4 is connected to the gate of the p-type transistor P2. The above-described configuration serves as a precharge circuit PC in which the pair of p-type transistors P1, P2 supply charge to the node W1 and the node W2, and the pair of n-type transistors N3, N4 disconnect the node W1 and the node W2 from ground, so that the node W1 (first node) and the node W2 (second node) are precharged to the high voltage of the high-voltage source VDD3.

Moreover, the level shift circuit of FIG. 1 includes two NAND circuits Nand1, Nand2 and two inverters INV1, INV2. The NAND circuit Nand1 receives output signals from the node W1 and the NAND circuit Nand2, and the NAND circuit Nand2 receives output signals from the node W2 and the NAND circuit Nand1. Moreover, the inverter INV1 receives the output signal from the NAND circuit Nand1, and an output of the inverter INV1 is connected to the gate of the p-type transistor P1 and the gate of the n-type transistor N3. The inverter INV2 receives the output signal of the NAND circuit Nand2, and an output of the inverter INV2 is connected to the gate of the p-type transistor P2 and the gate of the n-type transistor N4. The above-described configuration serves as a latch circuit LA which performs latch operation by detecting a reduction in potential at the nodes W1, W2, and controls operation of four transistors P1, P2, N1, N2 of the precharge circuit PC. Moreover, the two inverters INV1, INV2 form a precharge control circuit PCC which controls precharge operation of the precharge circuit PC.

Note that the level shift circuit of FIG. 1 includes a pull-up resistor (pull-up device) R4 set to a high resistance value and disposed between the node W1 and the node W2 so that the node W1 and the node W2 do not transition to a floating state. Any device can serve as the resistor R4, and for example, the resistor R4 may be made of a p-type transistor device having a gate connected to ground (VSS) and fixed at a zero potential.

Moreover, between an output terminal OUT and the high-voltage source VDD3, two p-type transistors P3, P4 are serially connected to each other, and a p-type transistor P5 is disposed in parallel with the p-type transistors P3, P4. On the other hand, between the output terminal OUT and ground (VSS), two n-type transistors N5, N6 are serially connected to each other, and an n-type transistor N7 is disposed in parallel with the n-type transistors N5, N6. Moreover, an inverter INV3 whose input is the node W2 is disposed. An output point of the NAND circuit Nand2 (an output node W4 of the latch circuit LA) is connected to the gate of the p-type transistor P3 and the gate of the n-type transistor N5. Moreover, a signal from the first node W1 is input to the gate of the p-type transistor P5 and the gate of the n-type transistor N6, and a signal obtained by inverting a signal from the second node W2 by the inverter INV3 is input to the gate of the p-type transistor P4 and the gate of the n-type transistor N7. The above-described configuration serves as an output circuit OC, and the output circuit OC is configured to output an output signal whose second voltage amplitude is the high voltage of the high-voltage source (VDD3) from the output terminal OUT.

Operation of the level shift circuit having the above-described configuration will be described below.

In the level shift circuit illustrated in FIG. 1, for example, when an input signal is at a H level (VDD), both the nodes W1, W2 are at a H level (VDD3), an output of the NAND circuit Nand1 is at the H level (VDD3), an output of the NAND circuit Nand2 is at a L level (VSS), and an output logic of the latch circuit LA including the NAND circuits Nand1, Nand2 is held in its state. Moreover, the output of the inverter INV1 is at the L level (VSS), the output of the inverter INV2 is at the H level (VDD3), and the p-type transistor P1 is in an on state and is connected to the high-voltage source VDD3, whereas the n-type transistor N3 is in an off state and is disconnected from ground, so that the node W1 is precharged to a potential equal to the potential of the high-voltage source VDD3. On the other hand, the p-type transistor P2 is in an off state and is disconnected from the high-voltage source VDD3, whereas the n-type transistor N4 is in an on state and connects the n-type transistor N2 to ground, and the node W2 is pulled up to the high-voltage source VDD3 by the p-type transistor P1 in the on state, the pull-up resistor R4 set to a high resistance value, and the n-type transistor N2 in the off state. As described above, both the nodes W1, W2 are at the H level (VDD3), the output of the NAND circuit Nand2 is at the L level (VSS), and an output of the inverter INV3 is at the L level (VSS). Thus, in the output circuit OC, the p-type transistors P3, P4 and the n-type transistor N6 are in the on state, and the p-type transistor P5 and the n-type transistors N5, N7 are in the off state. Thus, the output terminal OUT is at the H level (VDD3), and outputs a signal obtained by converting the voltage level of the input signal.

Figure 8:
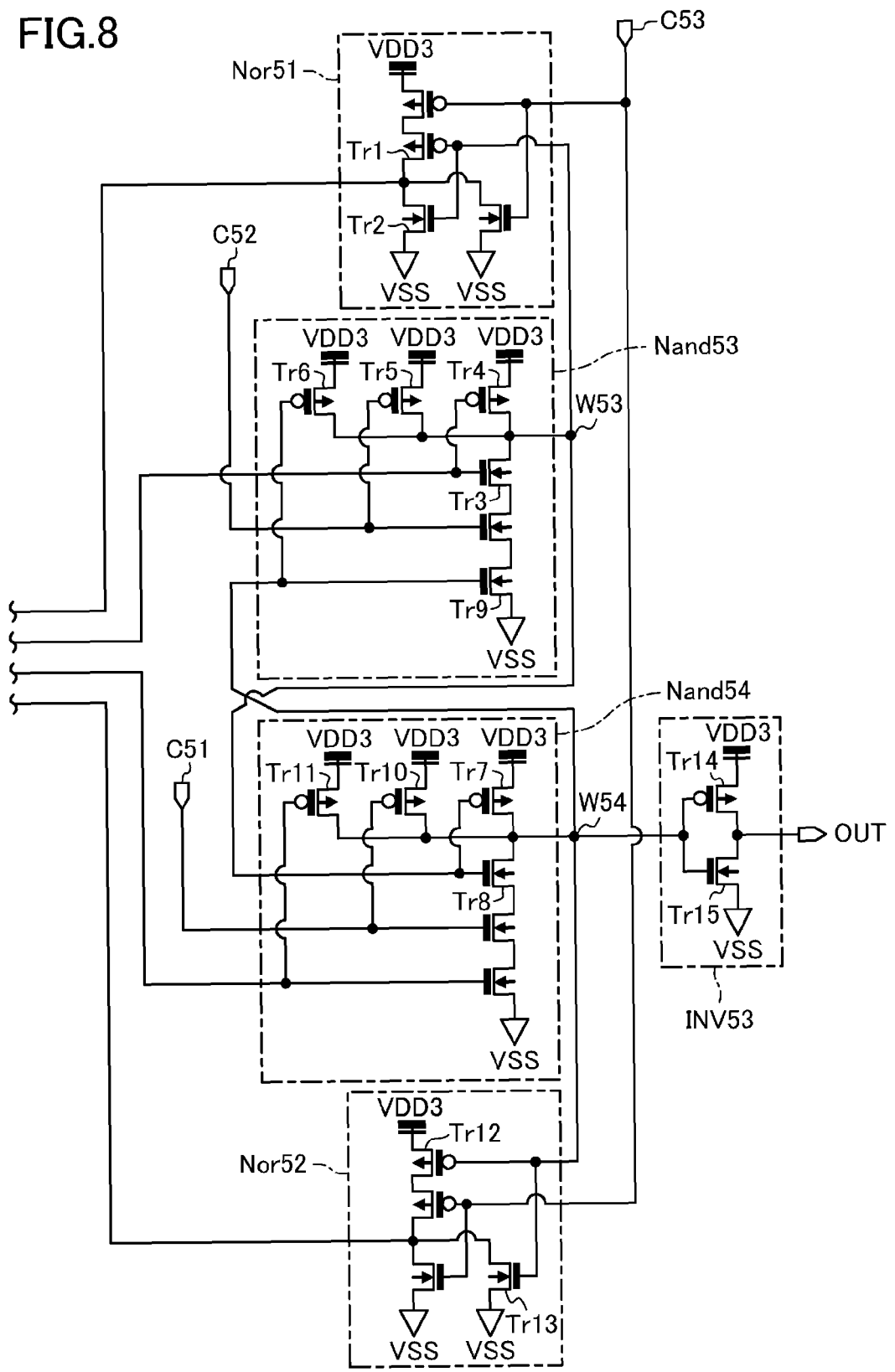
FIG. 8 is a specific configuration of main components of the level shift circuit of FIG. 6.

During state transition in which the input signal transitions from this state to the L level (VSS), the n-type transistor N1 is turned off, and the n-type transistor N2 (second discharge circuit) is turned on, so that the node W2, which has been pulled up to the high voltage (VDD3) by the pull-up resistor R4, is connected to ground via the n-type transistor N4 in the on state, decreases in potential, and discharges to the L level. Due to the decrease in potential at the node W2, the NAND circuit Nand2 and the inverter INV3 start pulling up the output node W4 and an output node W5, respectively, to the H level (VDD3). Here, the two transistors N7, P4 of the output circuit OC and two transistors included in the inverter INV3 (as to the configuration of the inverter, see, for example, the inverter INV53 of FIG. 8) are connected to the node W5. The number of transistors connected to the node W5 is, in total, four, and is less than half the number of transistors connected to the node W4 (output node of the NAND circuit Nand2) (ten transistors, see FIG. 8). Thus, the load capacitance of the node W5 is smaller than the load capacitance of the node W4, and thus the node W5 reaches the H level (VDD3) earlier than the node W4.

Figure 6:
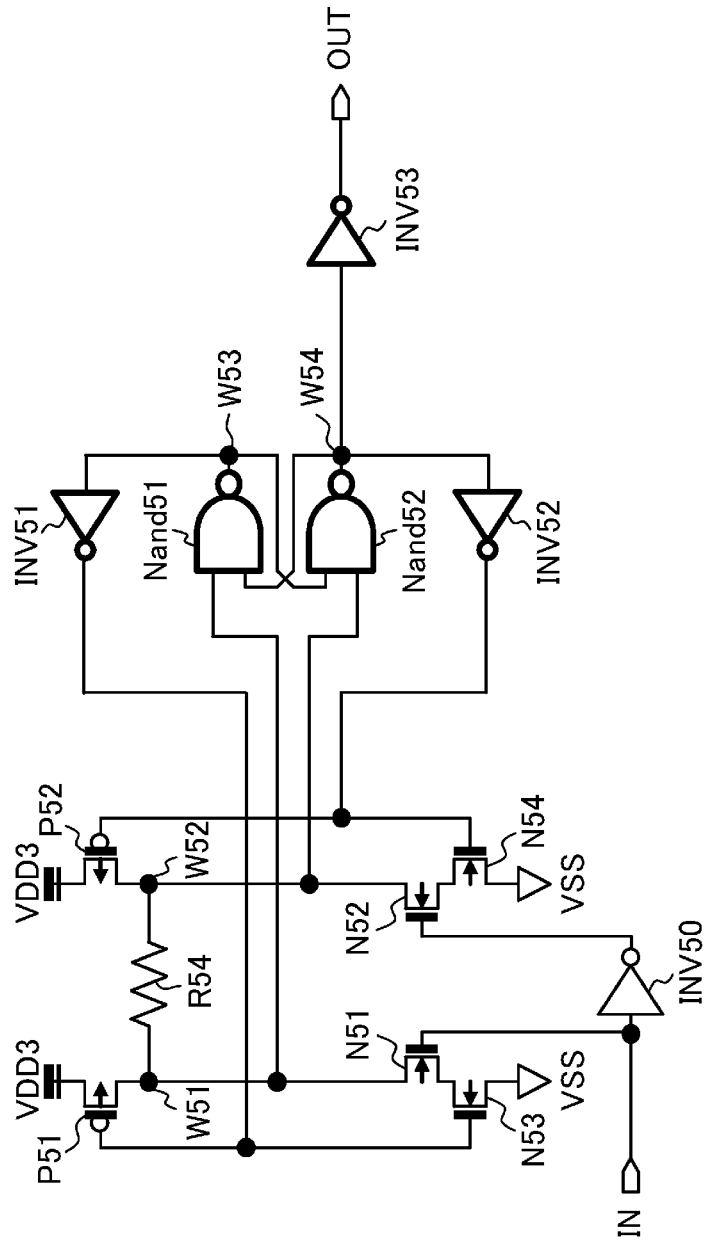
FIG. 6 is a view illustrating a configuration of a conventional level shift circuit obtained by improving the level shift circuit of FIG. 5.
Figure 7:
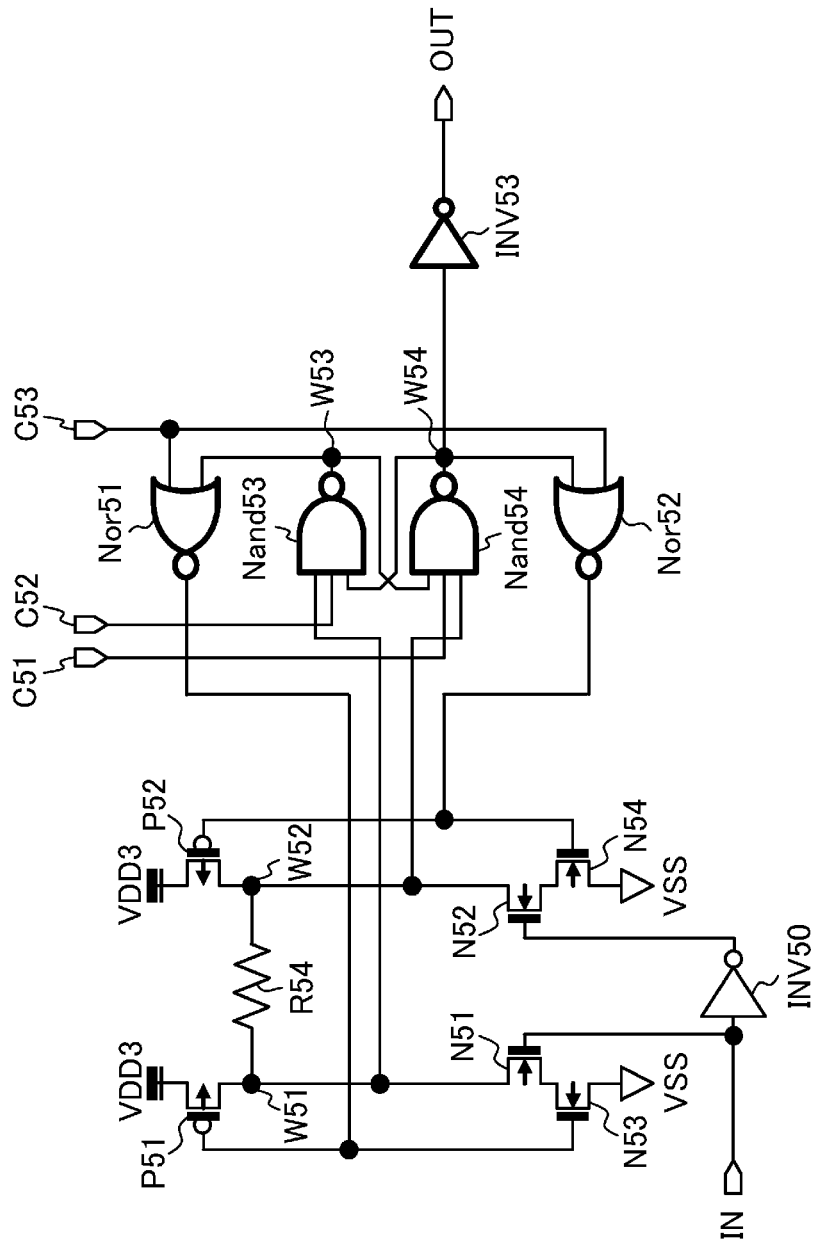
FIG. 7 is a view illustrating a variation of the level shift circuit of FIG. 6.

Thus, in the output circuit OC, prior to signal transition at the output node W4 of the latch circuit LA, the n-type transistor N7 is turned on, and the p-type transistor P4 is turned off, so that the output terminal OUT is disconnected from the high-voltage source (VDD3), and connection of the output terminal OUT to ground (VSS) is started. Thus, the output terminal OUT is inverted to the L level (VSS) at an early point in time compared to the proposed level shift circuit of FIG. 6.

After that, the output node W4 of the latch circuit LA also reaches the H level (VDD3) with a delay, the p-type transistor P3 is turned off, the n-type transistor N5 is turned on, and the output terminal OUT is held at the L level (VSS) by the n-type transistor N7, and the serially connected n-type transistors N5, N6 in the on state. Moreover, the output of the NAND circuit Nand1 is inverted to the L level (VSS), an output logic of the inverter INV1 is inverted to the H level (VDD3), and an output logic of the inverter INV2 is inverted to the L level (VSS), so that the n-type transistor N4 is turned off and disconnects the node W2 from ground, whereas the p-type transistor P2 is turned on and connects the node W2 to the high-voltage source VDD3. Thus, the node W2 is precharged to a potential equal to the potential of the high-voltage source VDD3. Since the node W2 reaches the H level (VDD3), the output of the inverter INV3 is inverted, the p-type transistor P4 is turned on, and the n-type transistor N7 is turned off, but the output terminal OUT is held at the L level (VSS) by the serially connected n-type transistors N5, N6. The p-type transistor P1 is turned off, whereas the and-type transistor N3 is turned on and connects the n-type transistor N1 to ground, and the node W1, which has been in a precharged state, is pulled up to the high voltage VDD3 by the p-type transistor P2 in the on state, the pull-up resistor R4, and the n-type transistor N1 in the off state, resulting in a stand-by mode for a next transition of the input signal.

The case where the input signal transitions from the H level (VDD) to the L level (VSS) has been described, but a similar statement applies to the opposite situation. Thus, converting H level and L level signals by the level shift circuit of FIG. 1 can generate H level and L level signals having different voltage levels.

As described above, the present embodiment further includes a signal path having a small load capacitance, extending from the node W2 to the output circuit OC, and bypassing the latch circuit LA in addition to a signal path extending from the node W2 to the output circuit OC via the latch circuit LA having a large load capacitance. With this configuration, signal transition at the node W2 propagates via the node W5 having a small load capacitance to the output circuit OC at an early point in time, and in response to the propagation, the output circuit OC immediately starts operating. Thus, it is possible to reduce delay until a state of the output signal from the output terminal OUT transitions compared to the conventionally proposed level shift circuit of FIG. 6.

Figure 2:
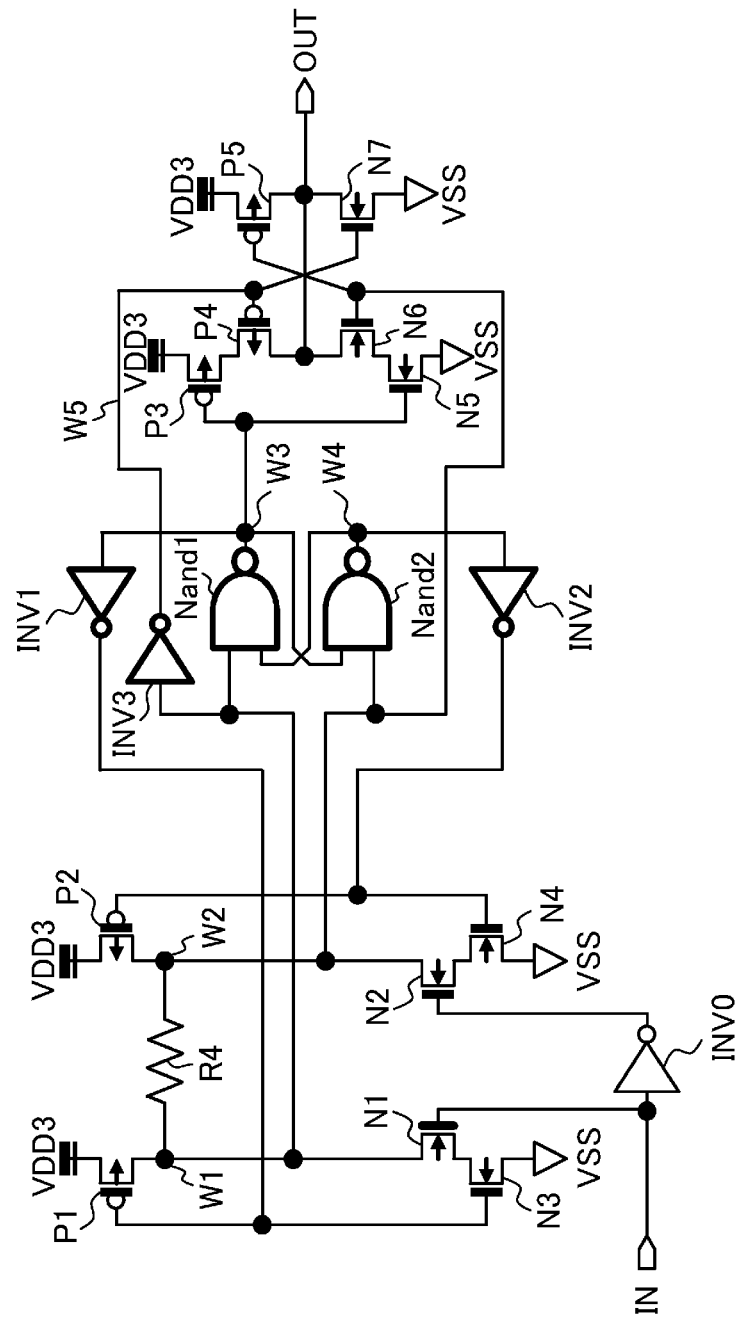
FIG. 2 is a view illustrating a variation of the level shift circuit of FIG. 1.

Note that the level shift circuit illustrated in FIG. 1 is configured such that in the output circuit OC, the output of the NAND circuit Nand2 is connected to the gate of the p-type transistor P3 and the gate of the n-type transistor N5, the node W1 is connected to the gate of the p-type transistor P5 and the gate of the n-type transistor N6, and an inverted output of the node W2 is connected to the gate of the p-type transistor P4 and the gate of the n-type transistor N7. However, this is not intended to limit the present invention. Any circuit configuration is applicable to the present invention as long as the output circuit OC is allowed to start operating by a signal which transitions prior to the transition of the output signal of the NAND circuit Nand1 or Nand2 of the latch circuit LA. For example, as illustrated in FIG. 2, a configuration in which the output of the NAND circuit Nand1 is connected to the gate of the p-type transistor P3 and the gate of the n-type transistor N5 of the output circuit OC, the node W2 is connected to the gate of the p-type transistor P5 and the gate of the n-type transistor N6, and an inverted output of the node W1 is connected to the gate of the p-type transistor P4 and the gate of the n-type transistor N7 can form a level shift circuit in which delay time of the transition of the output signal of the output terminal OUT is reduced.

Second Embodiment

Next, a second embodiment of the present invention will be described.

Figure 3:
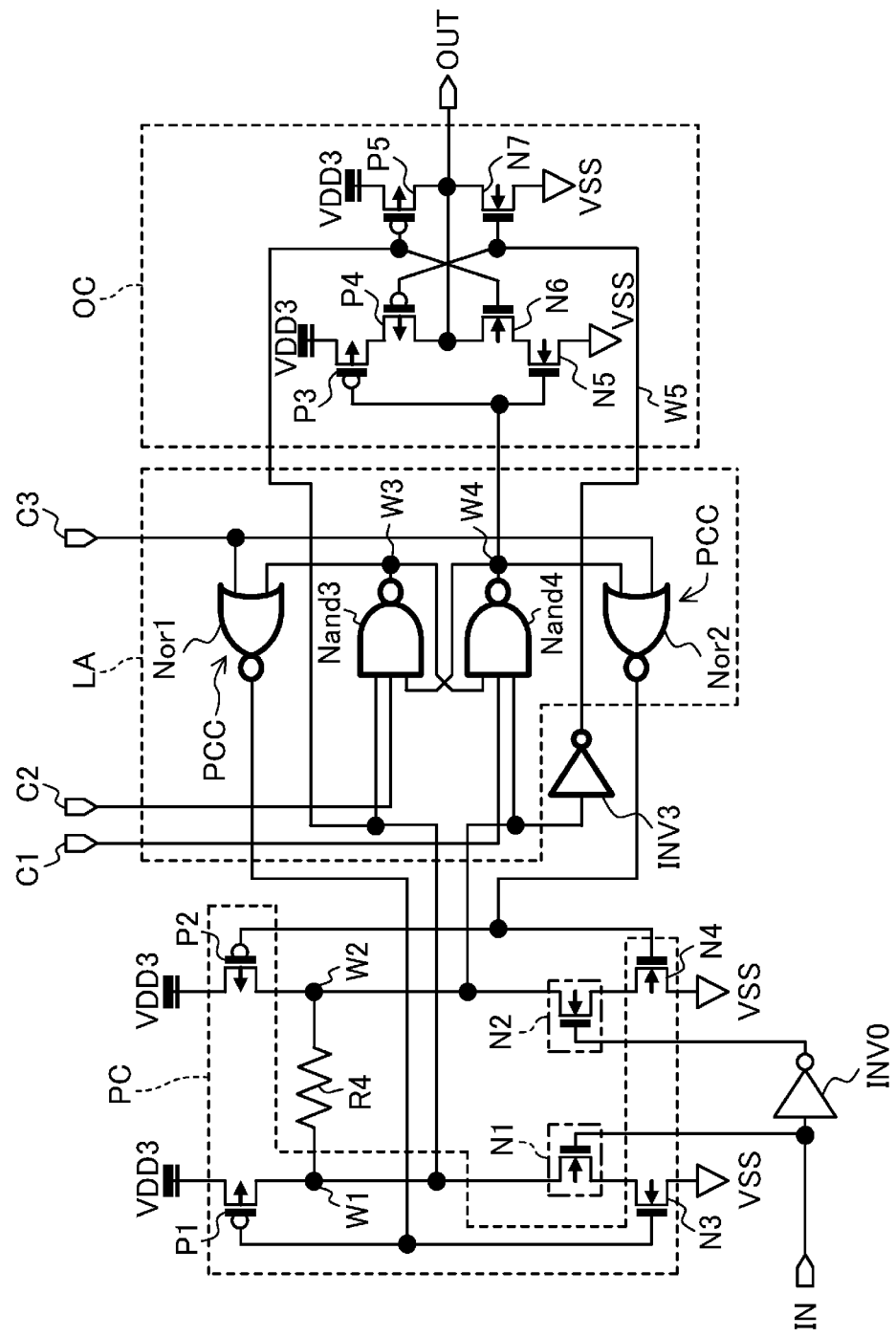
FIG. 3 is a view illustrating a configuration of a level shift circuit of a second embodiment of the present invention.

FIG. 3 is a view illustrating a configuration of a level shift circuit of the second embodiment of the present invention.

The configuration of the level shift circuit illustrated in FIG. 3 is different from the configuration of the level shift circuit of FIG. 1 only in that the inverters INV1, INV2 of FIG. 1 are respectively replaced with NOR circuits Nor1, Nor2 in FIG. 3, the NAND circuits Nand1, Nand2 of FIG. 1 are respectively replaced with three-input NAND circuits Nand3, Nand4 in FIG. 3, and three control signals C1, C2, C3 are further added in FIG. 3.

Operation of the level shift circuit of FIG. 3 is different from the operation of the level shift circuit of FIG. 1 in that the level shift circuit of FIG. 3 has a function applicable to a situation in which only a high-voltage source VDD3 is applied and a low-voltage source VDD is shut down.

That is, in the level shift circuit of FIG. 1, as previously described, when only the high-voltage source VDD3 is applied, and the low-voltage source VDD is shut down, an input signal is indeterminable, and a through current may flow to a downstream circuit. However, in the level shift circuit of FIG. 3, when the control signal C3 is set to a H level (VDD3), outputs of the two NOR circuits Nor1, Nor2 included in a precharge control circuit PCC reach a L level (VSS), and a precharge circuit PC is forced to perform precharge operation, so that n-type transistors N3, N4 are turned off, which can stop the through current.

Moreover, when a low-voltage source VDD is shut down, the control signal C1 is set to the H level (VDD3), and the control signal C2 is set to the L level (VSS), so that an output terminal OUT can be determined to be at the H level (VDD3). In contrast, when the control signal C1 is set to the L level (VSS), and the control signal C2 is set to the H level (VDD3), the output terminal OUT can be determined to be at the L level (VSS). Note that during normal operation, that is, when both the high-voltage source VDD3 and the low-voltage source VDD are applied, the control signal C1 is set to the H level (VDD3), the control signal C2 is set to the H level (VDD3), and the control signal C3 is set tot L level (VSS), thereby resulting in a circuit equivalent of the level shift circuit of FIG. 1, so that normal level shift operation can be performed.

In the level shift circuit of FIG. 3, the number of transistors connected to a node W3 and a node W4 is increased compared to the level shift circuit of FIG. 1, and the load capacitance is further increased. Thus, rising and falling delay time at the nodes W3, W4 is significantly long. In particular, the falling delay time at the nodes is further increased because the highly loaded nodes are driven by three serially connected n-type transistors of each of NAND circuits Nand1, Nand2 in a latch circuit LA. However, in the same manner as in the level shift circuit of FIG. 1, the node W4 having a large load capacitance (output node of the latch circuit LA) in the present embodiment is bypassed, and a change in potential at a node W2 (input node of the latch circuit LA) propagates to an output circuit OC through a signal path directly via an inverter INV3 to allow the output circuit OC to immediately start operating, so that even when a function is added as in the present embodiment, an increase in delay due to the added function can be reduced.

Figure 4:
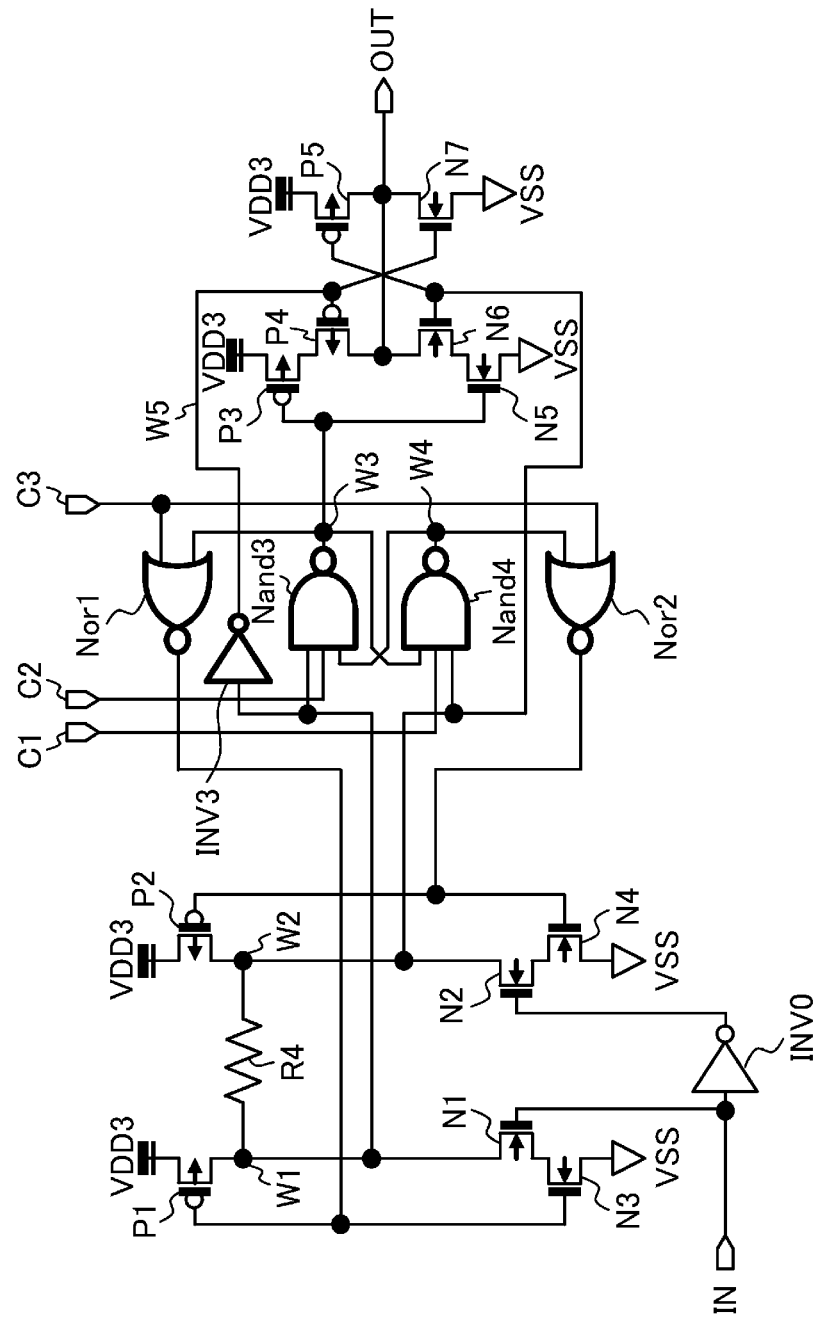
FIG. 4 is a view illustrating a variation of the level shift circuit of FIG. 3.
Figure 5:
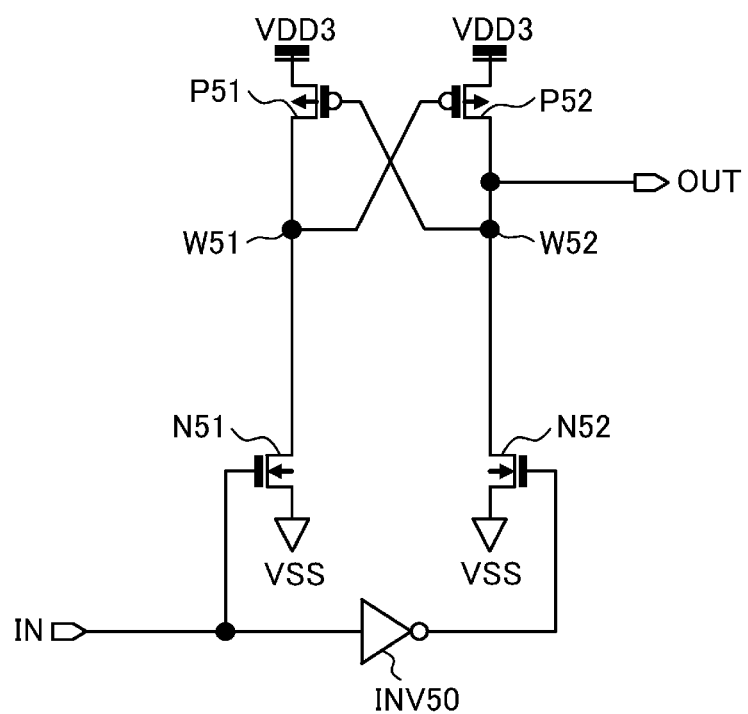
FIG. 5 is a view illustrating a configuration of a conventional level shift circuit.

Note that the level shift circuit illustrated in FIG. 3 is configured such that in the output circuit OC, an output of the NAND circuit Nand4 is connected to the gate of a p-type transistor P3 and the gate of an n-type transistor N5, a node W1 is connected to the gate of a p-type transistor P5 and the gate of an n-type transistor N6, and an inverted output of the node W2 is connected to the gate of a p-type transistor P4 and the gate of an n-type transistor N7. However, this is not intended to limit the present invention. Any circuit configuration is applicable to the present invention as long as the output circuit OC is allowed to start operating by a signal which transitions prior to the transition of a state of the output signal from the NAND circuit Nand3 or Nand4 of the latch circuit LA. For example, as illustrated in FIG. 4, a configuration in which the output of the NAND circuit Nand3 is connected to the gate of the p-type transistor P3 and the gate of the n-type transistor N5 of the output circuit OC, the node W2 is connected to the gate of the p-type transistor P5 and the gate of the n-type transistor N6, and an inverted output of the node W1 is connected to the gate of the p-type transistor P4 and the gate of the n-type transistor N7 can form a level shift circuit in which delay time of the transition of the output signal of the output terminal OUT is reduced.

As described above, the present invention is useful as level shift circuits which are capable of effectively reducing an increase in delay time in low-voltage setting of a low-voltage source, and operate at a high speed also in the case of normal-voltage setting where the voltage of the low-voltage source is set to a normal voltage and in the low-voltage setting. Even when a function applicable to the case where the low-voltage source is shut down is added, the delay does not increase, and thus the present invention is widely useful as level shift circuits.

What is claimed is:

1. A level shift circuit which includes an input terminal and an output terminal, converts an input signal input to the input terminal and having a first voltage amplitude into an output signal having a second voltage amplitude, and outputs the output signal from the output terminal, the level shift circuit comprising:
 a precharge circuit;
 a first node and a second node which are precharged to a high level in a stably operating state by the precharge circuit;
 a first discharge circuit configured to discharge the first node to a low level upon transition of the input signal from the low level to the high level;
 a second discharge circuit configured to discharge the second node to the low level upon transition of the input signal from the high level to the low level;
 a latch circuit connected to the first node and the second node, an output of the latch circuit being reset to the low level by the transition of the first node to the low level, and the output of the latch circuit being set to the high level by the transition of the second node to the low level to control the precharge circuit; and
 an output circuit configured to receive the output of the latch circuit, wherein
 the output circuit further receives a signal from the first node and an inversion signal from the second node, or an inversion signal from the first node and a signal from the second node.

2. The level shift circuit of claim 1, wherein
in the output circuit, a node configured to receive the inversion signal from the first or second node has a load capacitance which is smaller than a load capacitance of an output node of the latch circuit.

3. The level shift circuit of claim 1, wherein
in the output circuit, transistors connected to a node configured to receive the inversion signal from the first or second node are fewer than transistors connected to an output node of the latch circuit.

4. The level shift circuit of claim 1, wherein
the output circuit starts inversion operation upon reception of both the signals from the first and second nodes, and after that, the output circuit holds the inversion operation when the output circuit receives the output of the latch circuit.

5. The level shift circuit of claim 1, wherein
the latch circuit includes a precharge control circuit configured to control precharge operation of the precharge circuit based on latch operation.

6. The level shift circuit of claim 1, further comprising:
a pull-up device, wherein
while any one of the first or second node is precharged by the precharge circuit, the other of the first or second node is pulled up to the high level by the pull-up device.

7. The level shift circuit of claim 1, wherein
the first and second discharge circuits include transistors, and
a voltage source configured to generate a voltage having the first voltage amplitude is set to a generation voltage which is equal to a voltage close to a threshold voltage of the transistors.

8. The level shift circuit of claim 1, wherein
the first and second discharge circuits include transistors, and
a voltage source configured to generate a voltage having the first voltage amplitude is set to a generation voltage which is higher than a voltage close to a threshold voltage of the transistors.

9. The level shift circuit of claim 5, wherein
when voltage supply from a voltage source configured to generate a voltage having the first voltage amplitude is stopped, the precharge control circuit receives a control signal to control and force the precharge circuit to perform the precharge operation.

10. The level shift circuit of claim 9, wherein
when the voltage supply from the voltage source configured to generate the voltage having the first voltage amplitude is stopped, the latch circuit receives another control signal to determine the output signal from the output terminal to be at the high or low level.

* * * * *